United States Patent
Nitta et al.

(10) Patent No.: US 6,252,895 B1
(45) Date of Patent: Jun. 26, 2001

(54) DISTRIBUTED FEEDBACK SEMICONDUCTOR LASER IN WHICH LIGHT INTENSITY DISTRIBUTIONS DIFFER IN DIFFERENT POLARIZATION MODES, AND DRIVING METHOD THEREFOR

(75) Inventors: Jun Nitta, Yamanishi; Natsuhiko Mizutani, Tokyo, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/203,602

(22) Filed: Dec. 2, 1998

(30) Foreign Application Priority Data

Dec. 3, 1997 (JP) .................................................. 9-348508
Dec. 3, 1997 (JP) .................................................. 9-348509
Nov. 19, 1998 (JP) ............................................... 10-346621

(51) Int. Cl.$^7$ ................................ H01S 5/00; H01S 3/08
(52) U.S. Cl. ................................ 372/50; 372/45; 372/96
(58) Field of Search ................................ 372/26, 27, 29, 372/38, 32, 50, 96, 45

(56) References Cited

U.S. PATENT DOCUMENTS

| 5,202,782 | 4/1993 | Nakamura et al. | 359/152 |
|---|---|---|---|
| 5,440,581 | 8/1995 | Ono et al. | 372/96 |
| 5,521,754 | 5/1996 | Nitta et al. | 359/344 |
| 5,590,145 | 12/1996 | Nitta | 372/50 |
| 5,608,572 | 3/1997 | Nitta et al. | 359/344 |
| 5,659,560 | * 8/1997 | Ouchi et al. | 372/27 |
| 5,742,418 | 4/1998 | Mizutani et al. | 359/156 |
| 5,790,581 | 8/1998 | Nitta | 372/50 |

FOREIGN PATENT DOCUMENTS

| 2-117190 | 5/1990 | (JP) . |
| 2-159781 | 6/1990 | (JP) . |
| 7-162088 | 6/1995 | (JP) . |

* cited by examiner

Primary Examiner—Quyen P. Leung
(74) Attorney, Agent, or Firm—Fitzpatrick, Cella, Harper & Scinto

(57) ABSTRACT

A distributed feedback semiconductor laser includes a cavity extending in a cavity-axial direction. The cavity has a plurality of regions including a first region and a second region arranged along the cavity-axial direction and capable of being independently pumped. The laser further includes a plurality of waveguides with a diffraction grating and an active layer extending along the cavity-axial direction. The waveguides are formed in the regions, respectively, and coupled to each other along the cavity-axial direction. Different first and second polatization modes are defined by the coupled waveguides. The waveguides are constructed such that light intensity distributions along the cavity-axial direction in the first and second regions when pumped are different between the first and second polarization modes.

10 Claims, 18 Drawing Sheets

DISTRIBUTED FEEDBACK SEMICONDUCTOR LASER IN WHICH LIGHT INTENSITY DISTRIBUTIONS DIFFER IN DIFFERENT POLARIZATION MODES, AND DRIVING METHOD THEREFOR

BACKGROUND OF THE INVENTION

1. Field of the Invention

The present invention relates to a distributed feedback (DFB) semiconductor laser which can change its polarization mode of output light according to its pumped condition. The semiconductor laser can be used as a signal light source for optical transmission and the like. The invention also relates to a method of using the distributed feedback semiconductor laser.

2. Description of the Related Art

A conventional oscillation polarization mode selective DFB semiconductor laser as disclosed in Japanese Patent Application Laid-Open No. 7(1995)-162088, for example, uses a multi-electrode structure to control a relative relation between the wavelength dependency of gains created in the laser's active layer and Bragg wavelengths determined by a pitch and the like of its diffraction grating.

The following device has been developed and proposed as an oscillation polarization mode selective dynamic single mode semiconductor laser. The oscillation polarization mode selective device has a structure that can be modulated by a digital signal produced by superposing a minute-amplitude digital signal on a bias injection current. The device is a distributed feedback (DFB) laser in which a distributed reflector of a grating is introduced into a semiconductor laser resonator or cavity and wavelength selectivity of the grating is utilized. In the device, strain is introduced into an active layer of a quantum well structure, or its Bragg wavelength is located at a position shorter than a peak wavelength of a gain spectrum, so that gains for the transverse electric (TE) mode and the transverse magnetic (TM) mode are approximately equal for light at wavelengths close to an oscillation wavelength, under a current injection condition near an oscillation threshold. Further, a plurality of electrodes are arranged and currents are unevenly injected through those electrodes. An equivalent refractive index of the cavity is unevenly distributed by the uneven current injection, and oscillation occurs in one of the TE mode and the TM mode and at a wavelength which satisfies a phase matching condition and takes a minimum threshold gain. When the balance of the uneven current injection is changed slightly to vary a competitive relation of the phase condition between the TE mode and the TM mode, the oscillation polarization mode and wavelength of the device can be switched.

In that semiconductor device, an antireflection coating is provided on one end facet to asymmetrically employ effects of the uneven current injection into its output-side portion and its modulation-electrode portion. Alternatively, electrode lengths are varied to introduce a structural asymmetry.

FIG. 1 illustrates such a conventional structure. FIG. 1 is a cross-sectional view taken along a light propagation direction of the DFB semiconductor laser. In its structure, a lower clad layer 1010, an active layer 1011, a light guide layer 1012, an upper clad layer 1013, and a cap layer 1014 are laid down on a substrate 1009. A diffraction grating g is formed at an interface between the light guide layer 1012 and the upper clad layer 1013. The cap layer 1014 is divided into two along a cavity direction by a separating groove 1015. Currents can be injected into two electrically-independent active layer regions (portions under electrodes 1002 and 1003) by using the electrodes 1002 and 1003 formed on the cap layer 1014 and an electrode 1008 formed on a bottom surface of the substrate 1009. An antireflection film 1004 is provided on one end facet of the device.

Further, Japanese Patent Application Laid-Open No. 2(1990)-159781 discloses a three-electrode DFB semiconductor laser with a $\lambda/4$ phase shift section which can be used as a semiconductor laser for switching its lasing polarization mode between the TE mode and the TM mode. In the semiconductor laser, currents can be independently injected into its central region with the $\lambda/4$ phase shift section and two regions formed on both sides of the central region. Here, the lasing polarization mode can be switched between the TE mode and the TM mode by changing the current injected into the central region under a uniformly-injected current condition.

Furthermore, Japanese Patent Application Laid-Open No. 2(1990)-117190 discloses a semiconductor laser apparatus which has two semiconductor devices arranged serially or in parallel that primarily generate or amplify light waves in a predetermined polarization mode and another polarization mode, respectively.

However, the two conventional oscillation polarization mode selective DFB semiconductor lasers above select the TE or TM mode depending on the phase condition, and are sensitive to the phase at the end facet. As a result, the lasing wavelength and polarization mode of the device depend on the current injection condition in a complicated fashion, and fluctuation in characteristics of the lasing polarization mode appears among individual devices. In particular, regarding the fluctuation among devices, it is difficult to selectively impart a gain to one of the competing polarization modes when a current injected into one of two waveguide portions is increased, so that a lasing polarization switching point varies among the devices.

Further, in those two conventional lasers, the phase relations of resonant light in the cavity for respective polarization modes are controlled by the balance of currents injected into a uniform structure extending in the cavity direction (a uniform active layer and a uniform diffraction grating), and the lasing polarization mode is thus switched by changing the polarization mode whose oscillation threshold gain is the smallest. Therefore, those two lasers suffer the following disadvantages.

(1) Since the light phase is controlled, the lasing polarization mode is again returned to the TE mode, for example, when the switching from the TE mode to the TM mode is conducted by increasing a current injected into a certain region, and thereafter this current is further increased.

(2) Due to the multi-electrode structure, a common polarization mode is not selected among plural regions when currents injected into those regions increase. The respective regions are thus brought into independent lasing conditions, and those conditions influence each other to cause a plurality of longitudinal modes.

On the other hand, in the above third conventional DFB semiconductor laser, the light wave in the predetermined polarization mode is generated or amplified based on its geometrical shape, so that its yield varies due to processing fluctuations of etching depth and edge width during its ridge fabrication process.

SUMMARY OF THE INVENTION

An object of the present invention is to provide a distributed feedback semiconductor laser which can simplify its pumped condition (typically, its current injection condition) for causing the switching of its oscillation or lasing polarization mode, a method for driving the semiconductor laser, a light source apparatus which can perform the modulation with a large extinction ratio using the semiconductor laser, an optical transmission method using the semiconductor laser, an opto-electric converting apparatus suitably usable in the optical transmission method, an optical transmission system using the opto-electric converting apparatus, and so forth.

A distributed feedback semiconductor laser of the present invention includes a cavity extending in a cavity-axial direction, which has a plurality of regions including a first region and a second region arranged along the cavity-axial direction and capable of being independently pumped, and a plurality of waveguides with at least a diffraction grating and at least an active layer extending along the cavity-axial direction, which are formed in the regions, respectively, and coupled to each other along the cavity-axial direction. Different first and second polatization modes (typically, a TE mode and a TM mode) are defined by the coupled waveguides. The waveguides are constructed such that light intensity distributions along the cavity-axial direction in the first and second regions pumped by a control unit are different between the first and second polarization modes. The control unit independently pumps at least the first and second regions (typically, a current injecting unit). According to this fundamental structure, the competing relation between thershold gains for the first and second polarization modes can be preferably designed such that the polarization mode switching can be performed by a simple operation.

The following more specific structures are possible based on the above fundamental structure.

The waveguides are constructed such that difference fashions of the light intensity distributions along the cavity-axial direction between the first and second polarization modes are different between the first and second regions pumped by the control unit (see FIG. 2E).

The waveguides in the regions are constructed such that the light intensity distribution for the second polarization mode during an oscillation time in the first polarization mode has a stronger portion than the first polarization mode in the first region and that the light intensity distribution for the first polarization mode during an oscillation time in the second polarization mode has a stronger portion than the second polarization mode in the second region.

The waveguides in the regions are constructed such that a coupling coefficient (in other words, the feedback amount, or the reflectance) for the first polarization mode (the TE mode or the TM mode) is greater than a coupling coefficient for the second polarization mode (the TM mode or the TE mode) in the first region and that a coupling coefficient for the first polarization mode is smaller than a coupling coefficient for the second polarization mode in the second region.

A wavelength difference between Bragg wavelengths for the first and second polarization modes in the first region is different from a wavelength difference between Bragg wavelengths for the first and second polarization modes in the second region, and the waveguides are constructed such that when a wavelength of a minimum oscillation threshold for either of the first and second polarization modes in the first region coincides with a wavelength of a minimum oscillation threshold for said either of the first and second polarization modes in the second region, an oscillation threshold gain at the coincident wavelength is the smallest of threshold gains of a plurality of resonance modes created by the diffraction grating.

The waveguides in the regions are constructed such that a coupling coefficient of the diffraction grating for the second polarization mode in the second region is sufficiently large and a coupling coefficient of the diffraction grating for the first polarization mode in the second region is approximately zero (no feedback function). In this case, the waveguides in the regions may be constructed such that when a wavelength of a minimum oscillation threshold for the second polarization mode in the first region coincides with a wavelength of a minimum oscillation threshold for the second polarization mode in the second region, an oscillation threshold gain at the coincident wavelength is the smallest of threshold gains of a plurality of resonance modes created by said diffraction grating, and that when the wavelength of the minimum oscillation threshold for the second polarization mode in the first region does not coincide with the wavelength of the minimum oscillation threshold for the second polarization mode in the second region, an oscillation threshold gain for the first polarization mode is the smallest.

In the above structures, since the light intensity distributions in the cavity-axial direction for the competing polarization modes are made different from each other, the polarization mode switching can be readily performed by controlling the amounts of currents injected into the first and second regions. According to a first driving method, the semiconductor laser is brought into an oscillation condition in the first polarization by injecting the currents into the first and second regions, and the current injected into one of the first and second regions, whose light intensity distribution for the first polarization mode is smaller than its light intensity distribution for the second polarization mode, or whose coupling coefficient for the first polarization mode is smaller than its coupling coefficient for the second polarization mode, is relatively increased to stably switch the oscillation condition in the first polarization mode to an oscillation condition in the second polarization mode. A uniform current can be injected into the first and second regions to bring the semiconductor laser into the oscillation condition in the first polarization mode. Further, the current injected into one of the first and second regions, whose light intensity distribution for the second polarization mode is smaller than its light intensity distribution for the first polarization mode, or whose coupling coefficient for the second polarization mode is smaller than its coupling coefficient for the first polarization mode, is relatively increased to stably switch the oscillation condition in the second polarization mode to the oscillation condition in the first polarization mode. This driving method uses the property that when the current injected into the region whose light intensity distribution for a desired polarization mode is large is relatively increased, the lasing polarization mode can be readily and stably switched to this desired polarization mode.

According to another driving method, the currents are injected into the first and second regions by the control unit to bring the semiconductor laser into an oscillation condition in one of the first and second polarization modes, and the currents injected into the first and second regions are independently controlled such that a wavelength of a minimum oscillation threshold for the other of the first and second polarization modes in the first region coincides with a wavelength of a minimum oscillation threshold for the other of the first and second polarization modes in the second region to stably bring the semiconductor laser into an oscillation condition in the other of the first and second polarization modes.

According to yet another driving method, the currents are injected into the first and second regions by the control unit to bring the semiconductor laser into an oscillation condition in one of the first and second polarization modes, and the currents injected into the first and second regions are independently controlled such that a wavelength of a minimum oscillation threshold for said one of the first and second polarization modes in the first region is made different from a wavelength of a minimum oscillation threshold for said one of the first and second polarization modes in the second region to stably bring the semiconductor laser into an oscillation condition in the other of the first and second polarization modes.

Those two driving methods use the property that when a difference between the light intensity distributions for the competing polarization modes exists in the first and second regions, a difference between the Bragg wavelengths for those modes in the first region can be readily made different from that in the second region.

The above-discussed structures can be typically realized by such a structure in which the relation between the coupling coefficients for the competing polarization modes in the first region is opposite to that in the second region. For the same purpose, a phase shift section having the polarization dependency may be provided in a region, or a reflective face having the polarization dependency may be provided on the end facet of the device.

The above relations of the coupling coefficients can be achieved by the following structures.

A multiple quantum well light guide layer (this may be a strained multiple quantum well light guide layer) is formed in one of the first and second regions.

A multiple quantum well light guide layer is commonly formed in the first and second regions, and a portion of the multiple quantum well light guide layer in one of the first and second regions is crystallographically mixed.

A bulk layer with the diffraction grating is formed in one of the first and second regions and a multiple quantum well layer with the diffraction grating is formed in the other of the first and second regions.

Due to a large birefringence of the multiple quantum well light guide layer, the light intensity distributions in the waveguide-thickness direction perpendicular to the propagation direction for the competing modes can be made different. For example, where a non-strained multiple quantum well layer with the refractive index for the TE mode larger than that for the TM mode is inserted in a place away from the layer with the diffraction grating, the light intensity of the TE-mode light is weakened at the diffraction grating. When the multiple quantum well light guide layer is provided in one region to form the waveguide with the grating at which the TM-mode light intensity is made larger than the TE-mode light intensity, the waveguide with a large coupling coefficient for the TM mode can be formed. The coupling coefficient for the TE-mode light is larger in an ordinary diffraction grating, so that the above relation of the coupling coefficients can be established by the combination of those regions.

Further, the birefringence of the multiple quantum well layer is lost by the crystallographical mixing. Due to this property, the light intensity distributions in the waveguide-thickness direction perpendicular to the propagation direction for the competing modes are made different in the non-mixed waveguide to form a waveguide with a large coupling coefficient for the TM mode, while a waveguide with a large coupling coefficient for the TE mode is formed by the mixed waveguide lacking the birefringence.

In the structure which includes the regions having the multiple quantum well layer with the grating and the bulk layer with the grating, the refractive-index difference between the multiple quantum well layer and the burying layer sensed by the TM-mode light is larger than that sensed by the TE-mode light in the region having the multiple quantum well layer with the grating. This region can be the region with the coupling coefficient for the TM mode larger than that for the TE mode, and the region having the bulk layer with the grating can be the region with the coupling coefficient for the TM mode smaller than that for the TE mode. The above relation of the coupling coefficients can be established by the combination of those regions.

Further, at least one of two semiconductor layers forming the diffraction grating at an interface therebetween in at least one of the first and second regions may be made of at least one of tensile-strained and compressively-strained quantum well layers such that the above relations between the coupling coefficients for the first and second polarization modes are established in the first and second regions, respectively. In this structure, the strained quantum well shows different refractive indices for the competing polarization modes, the other semiconductor layer for forming the grating is made of a semiconductor layer whose refractive index is equal to that of the strained semiconductor layer for one of the competing modes, and the diffraction grating is formed at the interface between those layers. Thus, light in one of the competing modes cannot sense the diffraction grating. Further, the coupling coefficients of the grating for the competing modes can be made different by using as the other semiconductor layer a semiconductor layer whose refractive index differs from both refractive indices of the strained quantum well for the competing modes.

Furthermore, the active layer can be commonly formed in the first and second regions and constructed such that an approximately equal gain is imparted to each of the first and second polarization modes. In this structure, contribution of the polarization dependency of the gain in the active layer to the mode switching characteristic is reduced by using such an active layer. Thus, the mode switching can be readily effected by controlling the injected currents.

Further, the diffraction grating can be uniformly formed commonly in the first and second regions. A phase shift section can be formed in the diffraction grating in each of the first and second regions such that wavelengths of minimum oscillation thresholds for the first and second polarization modes are Bragg wavelengths in the first and second regions, respectively.

These advantages and others will be more readily understood from the following detailed description of the preferred embodiments in conjunction with the drawings.

DESCRIPTION OF THE PREFERRED EMBODIMENTS

First Embodiment

Figure 1:
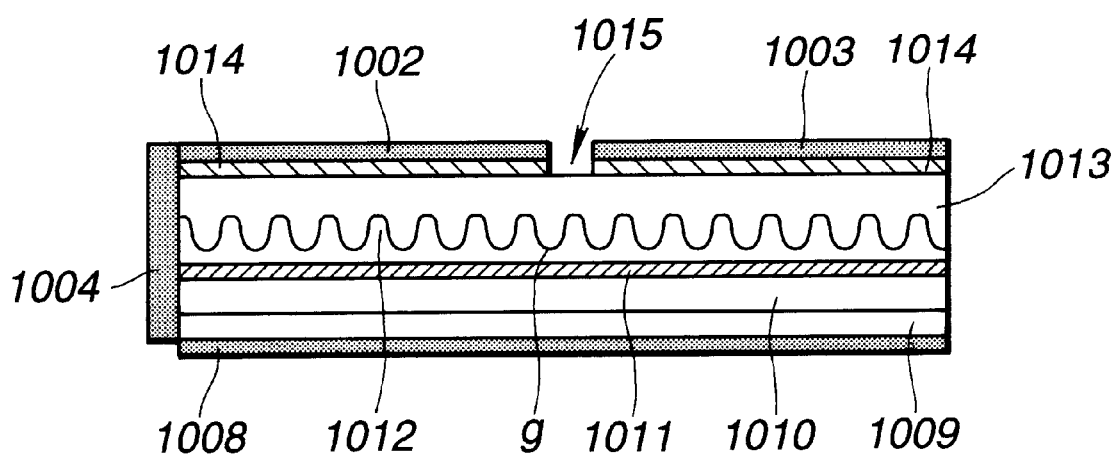
FIG. 1 is a cross-sectional view illustrating the structure of a conventional DFB semiconductor laser.
Figure 2:
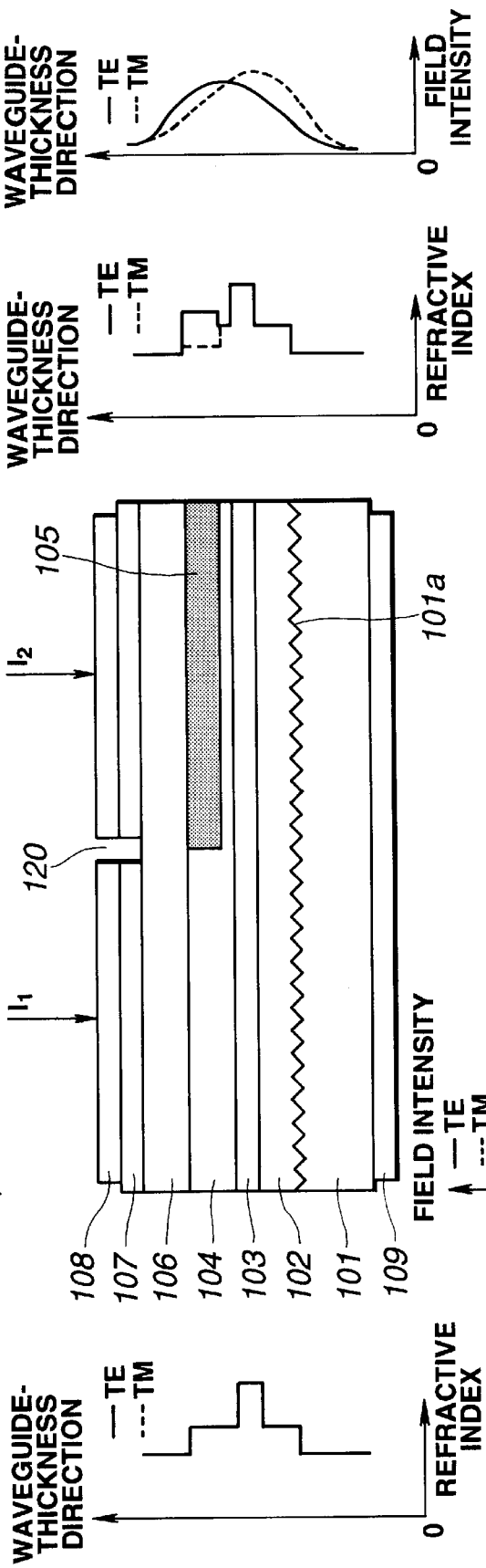
FIG. 2A is a cross-sectional view illustrating the cross section taken along a cavity-axial direction of a first embodiment of a DFB semiconductor laser according to the present invention.
FIGS. 2B and 2C are views illustrating refractive-index distributions of waveguides along a waveguide-thickness direction in the first embodiment, respectively.
FIG. 2D is a view illustrating a light intensity distribution of a waveguide along a waveguide-thickness direction in the first embodiment.
FIG. 2E is a view illustrating a light intensity distribution of a waveguide along a cavity-axial direction in the first embodiment.

A first embodiment of the present invention, directed to a distributed feedback (DFB) semiconductor laser, will be described with reference to FIGS. 2A–2E and FIG. 3.

The device has the following structure. In FIG. 2A, reference numeral 101 designates an n-type InP substrate. Periodic striped grooves 101a (which extend perpendicularly to the sheet of FIG. 2A and are arranged along right and left directions of FIG. 2A) with a depth of 0.05 $\mu$m and a pitch of 240 nm acting as a diffraction grating are formed on the substrate 101. Further, reference numeral 102 designates a lower light guide layer of n-InGaAsP with a thickness of 0.1 $\mu$m and a bandgap wavelength of 1.17 $\mu$m. Reference numeral 103 designates a strained triple quantum well active layer having InGaAs well layers with a thickness of 13 nm, into which a 0.6% tensile strain is introduced, and InGaAsP barrier layers with a thickness of 10 nm and a bandgap wavelength of 1.17 $\mu$m. Reference numeral 104 designates an upper light guide layer of p-InGaAsP with a bandgap wavelength of 1.17 $\mu$m formed in a first region 110. Reference numeral 105 designates a p-doped multiple compressively-strained quantum well light guide layer formed in a second region 111. Reference numeral 106 designates a p-type InP clad layer. Reference numeral 107 designates a p-type InGaAs contact layer. Reference numeral 108 designates a p-electrode of a Cr/Au layer. Reference numeral 109 designates an n-electrode of an AuGe/Au layer formed on the substrate side. A separating portion 120 is formed by partly removing the p-electrode 108 and p-InGaAs layer 107, and the device is separated into the first and second regions 110 and 111 by the separating portion 120.

In the 0.6% tensile-strained quantum well active layer 103 with the well thickness of 13 nm, its heavy hole energy level is approximately equal to its light hole energy level. Therefore, gains for TM-mode light and TE-mode light are close to each other, thereby establishing an active layer structure enabling the polarization switching phenomenon.

In the compressively-strained multiple quantum well layer 105 by which a portion of the upper light guide layer 104 is replaced, ten pairs of $In_{0.89}Ga_{0.11}As_{0.49}P_{0.51}$ well layers with 0.8% compressive strain and a thickness of 7 nm and non-strained $In_{0.86}Ga_{0.14}As_{0.31}P_{0.69}$ barrier layers with a thickness of 5 nm are deposited to construct a ten-well quantum well layer.

According to the thus-formed quantum well layer 105, its bandgap wavelength (Eg) for the TE mode is 1.30 $\mu$m and Eg for the TM mode is shorter than this value, namely 1.26 $\mu$m. Its refractive index sensed by the TE-mode light at a wavelength of 1.55 $\mu$m is 3.357, while that sensed by the TM-mode light is 3.330. On the other hand, the refractive index of the p-InGaAsP light guide layer 104 (Eg=1.17 $\mu$m) is 3.331. Thus, the index profiles as illustrated in FIGS. 2B and 2C are obtained for the first and second regions 110 and 111, respectively.

Profiles in the layering (waveguide-thickness) direction of refractive indices sensed by the TE-mode light and the TM-mode light in the first region 110 lacking the multiple quantum well layer 105 are illustrated in FIG. 2B (these index profiles overlap in almost all portions). Those in the second region 111 with the multiple quantum well layer 105 are illustrated in FIG. 2C. As can be seen from FIG. 2C, the refractive index sensed by the TE-mode light is considerably larger than that of the TM-mode light in the quantum well layer 105. According to the birefringence of the quantum well layer 105, light intensity distributions (light's electric-field intensity distributions) differ between TE-mode and TM-mode, as illustrated in FIG. 2D. A strong portion of the intensity distribution for the TE-mode light is shifted toward the multiple quantum well layer 105.

The device of this embodiment is fabricated as follows. A stripe pattern of a 240 nm pitch for achieving the diffraction grating is formed by processing a resist layer deposited on the n-InP substrate 101 using a holographic lithography method. The stripe pattern is transferred to the substrate 101 by etching. The resist is then removed, and a damaged layer on the substrate surface is removed by wet etching. The first crystal growth is then performed using a metal organic chemical vapor phase epitaxy (MOVPE) method to form the layers 102 and 103, a portion of the layer 104 (corresponding to a portion under the layer 105), and the layer 105. A selective growth mask of a $SiO_2$ layer is laid down over the light guide layer 105, and a portion of the $SiO_2$ layer (a portion in the region 110) is removed by photolithography. The light guide layer 105 is partly removed by a selective etching using the SiO₂ layer as a mask. Furthermore, a portion of the light guide layer 104 (a portion laterally adjacent to the layer 105) is grown by a selective growth (the second crystal growth) using the SiO₂ layer as a mask. After the SiO₂ mask is removed, the p-InP clad layer 106 and the p-InGaAs contact layer 107 are formed over the entire wafer by the third crystal growth. The upper electrode 108 is formed by a lift-off process using a resist pattern formed by a photolithography process. The contact layer 107 in the separating region 120 is removed to obtain the electric separation thereat. The wafer is then lapped, and the lower electrode 109 is formed on the bottom surface of the substrate 101. Alloying of the electrodes and cleaving of the wafer are performed to construct a DFB laser.

In the thus-fabricated structure, a waveguide with a usual diffraction grating having a coupling coefficient for the TE-mode light larger than that for the TM-mode light is formed in the first region 110, while a waveguide with a diffraction grating having a coupling coefficient for the TM-mode light larger than that for the TE-mode light is formed in the second region 111 since a strong portion of the light intensity distribution for the TE mode is shifted away from the diffraction grating 101*a*.

Light intensity distributions in the cavity-axial direction of a cavity with the above diffraction grating 101*a* are illustrated for laser oscillation modes of the cavity, namely TE mode and TM mode, in FIG. 2E. As seen therefrom, light intensity distributions in the cavity-axial direction during operation are different between the TE mode and the TM mode. In more detail, the TE mode has a stronger light intensity distribution than the TM mode in the first region 110, while the TM mode has a stronger light intensity distribution in the second region 111.

Figure 3:
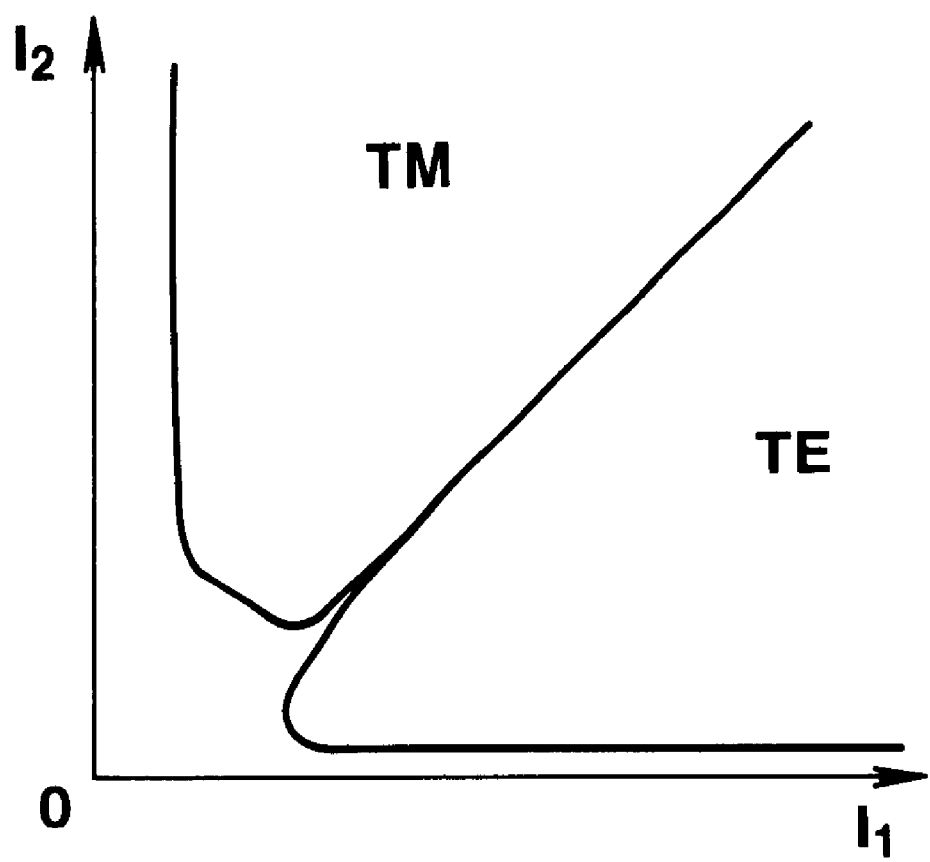
FIG. 3 is a graph illustrating an operation of the first embodiment.

The device is lased by pumping the regions by injecting currents $I_1$ and $I_2$ into the first and second regions 110 and 111, respectively. FIG. 3 shows the relation between amounts of injected currents and the oscillation polarization mode. Oscillation in the TM mode can be obtained under a uniform current injection condition shown by dotted line in FIG. 3. Namely, the tensile-strained active layer 103 of the triple quantum well structure and so forth are constructed such that this oscillation manner can be attained. Under the uniform injection condition, as the current injected into the first region 110 (the TE mode has a relatively strong distribution of the light intensity in this region 110) is increased, the current injected therein imparts more gain to the TE mode than to the TM mode. Therefore, there exists a current injection point where the lasing mode changes from the TM mode to the TE mode. Even if the current injected into the first region 110 is further increased, oscillation in the TE mode remains unchanged. When the lasing state is to be returned from the TE mode to the TM mode, the current injected into the second region 111 (the TM mode has a relatively strong distribution of the light intensity in this region 111) only needs to be relatively increased by, for example, returning the current condition to the initial uniform current injection condition.

Regarding the relation between the bias condition of the two-electrode device and the lasing polarization mode, the TE-mode oscillation is effected when the current injected into the first region 110 is larger, while the TM-mode oscillation is effected when the current injected into the second region 111 is larger, as discussed above. This phenomenon results from an asymmetric structure of the first and second regions 110 and 111 concerning the polarization mode.

In this embodiment, the waveguides in the first and second regions 110 and 111 are constructed such that trends in the difference between the light intensity distributions along the cavity-axial direction for the TE mode and the TM mode are different between the first and second and second regions 110 and 111 pumped by the currents. As a result, effects (or coupling coefficients) of the diffraction grating for both modes are varied between the respective regions, and thus wavelength differences between Bragg wavelengths for both modes are different from each other between the first and second regions 110 and 111, so that the lasing polarization mode of this embodiment can also be changed by an operation method to be described in a fourth embodiment.

Second Embodiment

Figure 4:
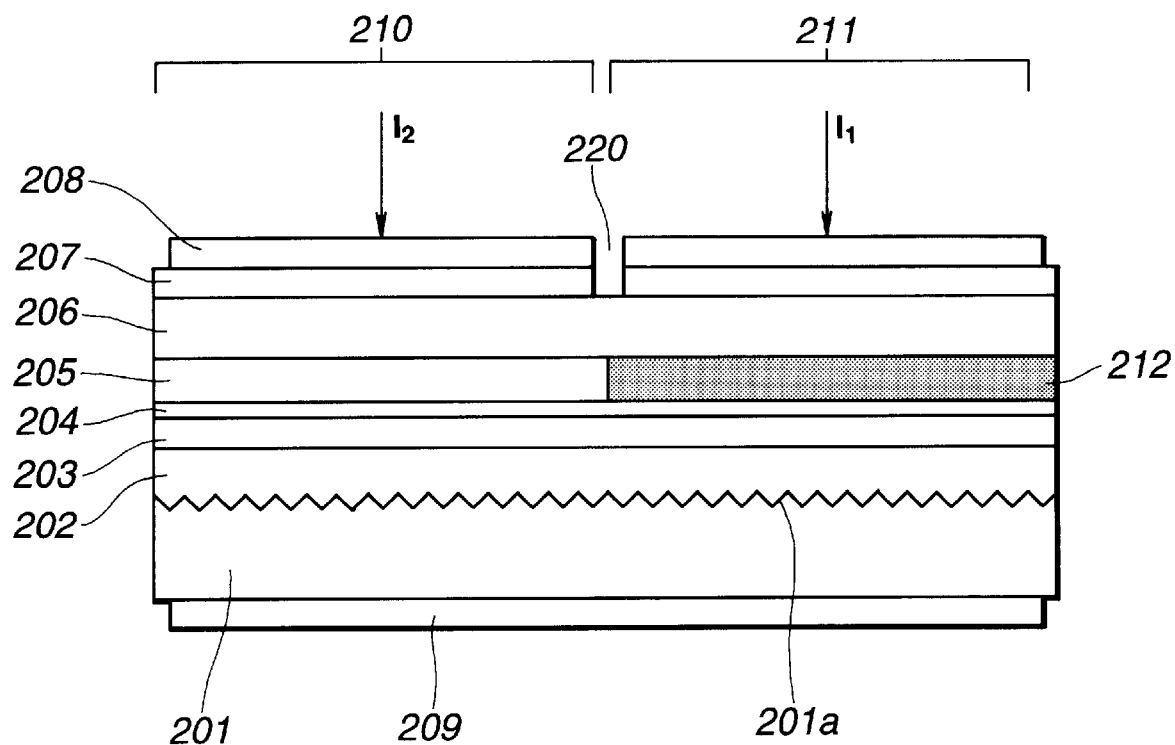
FIG. 4 is a cross-sectional view illustrating the cross section taken along a cavity-axial direction of a second embodiment of a DFB semiconductor laser according to the present invention.

A second embodiment of the present invention will be described with reference to FIG. 4. The second embodiment is different from the first embodiment in its layer structure.

The device of the second embodiment has the following structure. In FIG. 4, reference numeral 201 designates an n-type InP substrate. Periodic striped grooves 201*a* with a depth of 0.05 μm acting as a diffraction grating are formed on the substrate 201, similarly to the first embodiment. Further, reference numeral 202 designates a lower light guide layer of InGaAsP with a thickness of 0.1 μm and a bandgap wavelength of 1.17 μm. Reference numeral 203 designates an InGaAsP active layer with a thickness of 0.1 μm. Reference numeral 204 designates an upper light guide layer of InGaAsP with a bandgap wavelength of 1.17 μm. Reference numerals 205 and 212 designate multiple compressively-strained quantum well light guide layers, respectively. Reference numeral 206 designates a p-type InP clad layer. Reference numeral 207 designates a p-type InGaAs contact layer. Reference numeral 208 designates a p-electrode of a Cr/Au layer. Reference numeral 209 designates an n-electrode of an AuGe/Au layer formed on the substrate side. A separating portion 220 is formed by partly removing the p-electrode 208 and p-InGaAs layer 207, and the device is separated into first and second regions 210 and 211 by the separating portion 220.

Crystal of a portion in the first region 210, i.e., the light guide layer 205, of the compressively-strained light guide layers 205 and 212 is mixed by proton bombardment, so that the birefringence of the layer 205 is reduced.

The device of this embodiment is fabricated as follows. A stripe pattern of a 240 nm pitch for obtaining the diffraction grating is formed on a resist layer deposited on the n-InP substrate 201 by processing the resist layer using the holographic lithography method. The stripe pattern is transferred to the substrate 201 by etching. The resist is then removed, and a damaged layer on the substrate surface is removed by wet etching. A crystal growth is then performed using the MOVPE method to form the layers 202, 203, 204, 205, 206 and 207. In the first region 210, the crystal of the compressively-strained quantum well light guide layer 205 is crystallographically mixed, and the birefringence of the layer 205 is thus reduced. The upper electrode 208 is then formed by the lift-off process using a resist pattern formed by photolithography. The contact layer 207 in the separating region 220 is removed to obtain the electric separation thereat. The wafer is then lapped, and the lower electrode 209 is formed on the bottom surface of the substrate 201. Alloying of the electrodes and cleavage of the wafer are performed to construct a DFB laser.

In the thus-fabricated structure, a waveguide with a usual diffraction grating having a coupling coefficient for the TE-mode light larger than that for the TM-mode light is formed in the first region 210, while a waveguide with a diffraction grating having a coupling coefficient for the TM-mode light larger than that for the TE-mode light is formed in the second region 211 since the TE-mode light is attracted toward the compressively-strained light guide layer 212.

The mode switching during the current injection time and the selection of the lasing polarization mode in a nonuniform current injection state are the same as those of the first embodiment.

Third Embodiment

A third embodiment of the present invention will be described with reference to FIG. 5. A device of the third embodiment has the following structure.

Figure 5:
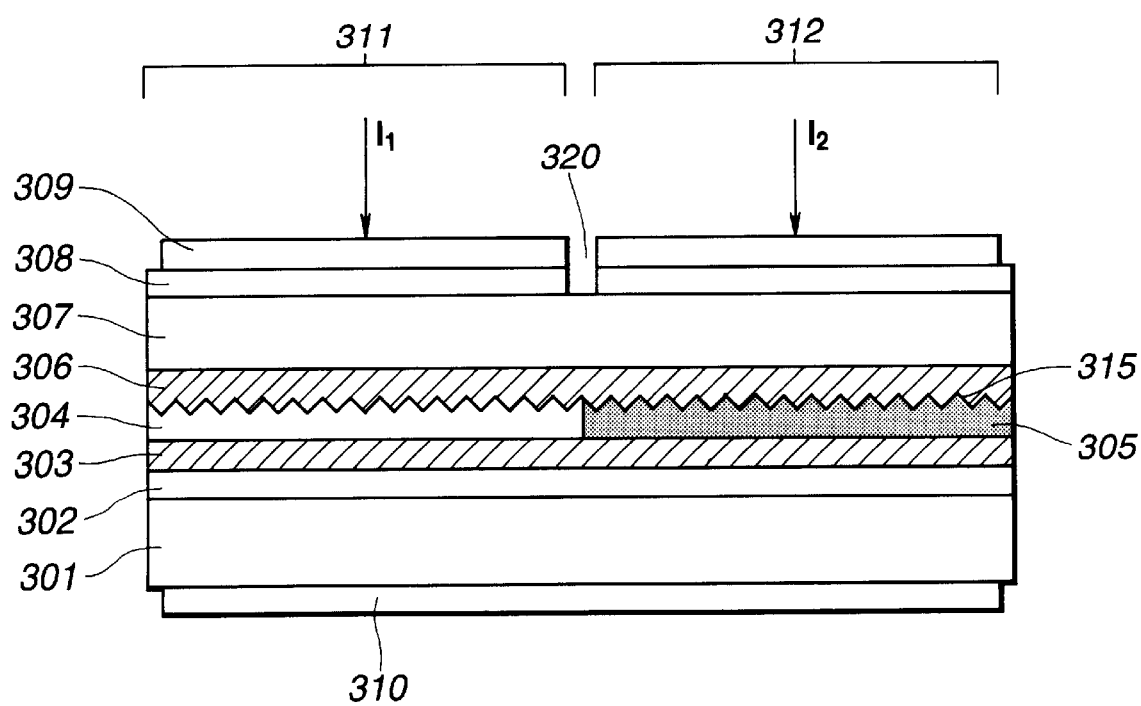
FIG. 5 is a cross-sectional view illustrating the cross section taken along a cavity-axial direction of a third embodiment of a DFB semiconductor laser according to the present invention.

In FIG. 5, reference numeral 301 designates an n-type InP substrate. Reference numeral 302 designates a lower light guide layer of InGaAsP with a thickness of 0.1 $\mu$m and a bandgap wavelength of 1.17 $\mu$m. Reference numeral 303 designates a triple strained quantum well active layer having InGaAs well layers with a thickness of 13 nm, into which a 0.6% tensile strain is introduced, and InGaAsP barrier layers with a thickness of 10 nm and a bandgap wavelength of 1.17 $\mu$m. Reference numeral 304 designates an upper light guide layer of InGaAsP with a bandgap wavelength of 1.17 $\mu$m formed in a first region 311. Reference numeral 305 designates a compressively-strained multiple quantum well light guide layer formed in a second region 312. Periodic striped grooves 315 acting as a diffraction grating are formed on the light guide layers 304 and 305 with a common pitch. The grooves 315 are buried with a second upper light guide layer 306 whose bandgap wavelength is longer than that of the first light guide layers 304 and 305. That is, for lasing light, the refractive index of the second upper light guide layer 306 is larger than that of the first upper light guide layers 304 and 305.

Further, reference numeral 307 designates a p-type InP clad layer. Reference numeral 308 designates a p-type InGaAs contact layer. Reference numeral 309 designates a p-electrode of a Cr/Au layer. Reference numeral 310 designates an n-electrode of an AuGe/Au layer formed on the substrate side. A separating portion 320 is formed by partly removing the p-electrode 309 and p-InGaAs layer 308, and the device is divided into the first and second regions 311 and 312 by the separating portion 320.

The device of this embodiment is fabricated as follows. A crystal growth is performed using the MOVPE method to form the layers 302, 303 and 305 on the n-InP substrate 301. A SiO$_2$ layer acting as a selective growth mask is deposited on the compressively-strained quantum well light guide layer 305. A portion of the SiO$_2$ layer (a portion thereof in the first region 311) is removed using photolithography. The light guide layer 305 in the first region 311 is removed by a selective etching using the SiO$_2$ layer as a mask. Further, the light guide layer 304 is grown in the first region 311 by a selective growth (the second crystal growth) using the SiO$_2$ layer as a mask. After the SiO$_2$ mask is removed, a resist layer is coated and periodic striped grooves are then formed using the photographic lithography method. The stripe pattern is transferred to the light guide layers 304 and 305 by etching. The resist is then removed, and a damaged layer on the wafer surface is removed by wet etching. A third crystal growth is then performed using the MOVPE method to form the light guide layer 306, the p-InP clad layer 307 and the p-InGaAs contact layer 308 over the entire wafer. The upper electrode 308 is then formed by the lift-off process using a resist pattern formed by the photolithography. The contact layer 308 in the separating region 320 is removed to obtain the electric separation thereat. The wafer is then lapped, and the lower electrode 310 is formed on the bottom surface of the substrate 301. Alloying and cleavage are performed to construct a DFB laser.

In the thus-fabricated structure, a waveguide with a diffraction grating having a coupling coefficient for the TM-mode light larger than that for the TE-mode light is formed in the second region 312 where the periodic striped grooves 315 are formed on the compressively-strained light guide layer 305 with a refractive index for the TM mode larger than that for the TE mode and the grooves 315 are buried with the second light guide layer 306 with a large refractive index, since an index difference for the TM-mode light between the layers 305 and 306 is large in the second region 312. In contrast, a waveguide with a usual diffraction grating having a coupling coefficient for the TE-mode light larger than that for the TM-mode light is formed in the first region 311 lacking the light guide layer 305 having the birefringence.

The mode switching during the current injection time and the selection of the lasing polarization mode in a nonuniform current injection state are the same as those of the first embodiment.

Fourth Embodiment

Figure 6:
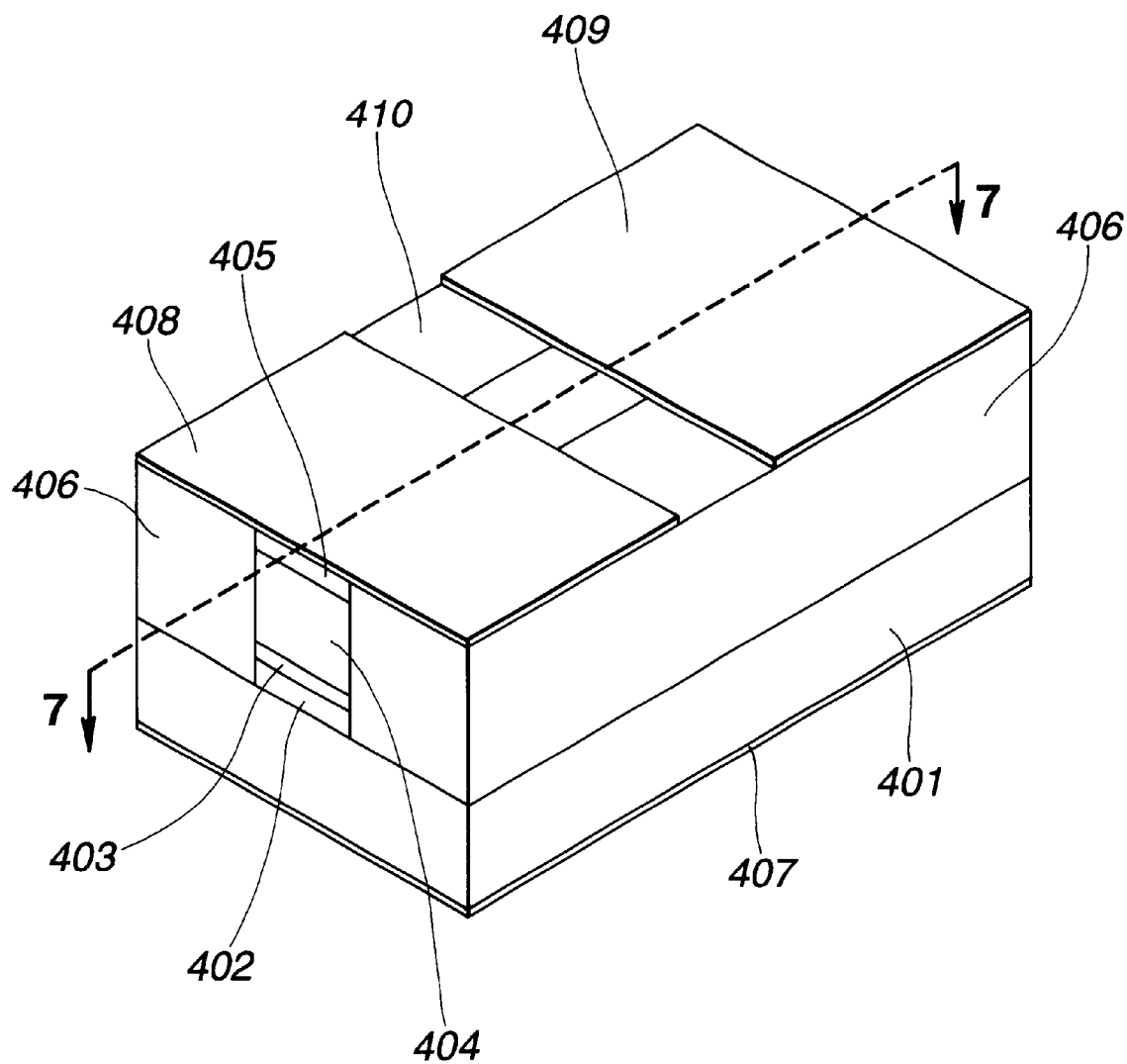
FIG. 6 is a perspective view illustrating the structure of a fourth embodiment of a DFB semiconductor laser according to the present invention.
Figure 7:
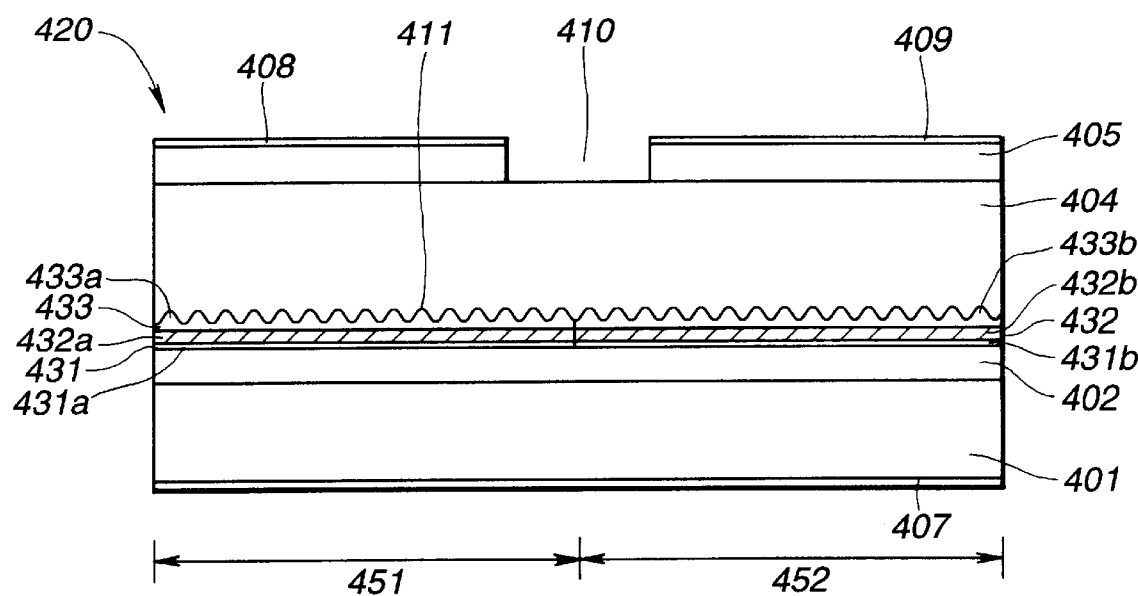
FIG. 7 is a cross-sectional view illustrating the cross section taken along a 7—7' line of FIG. 6.
Figure 8:
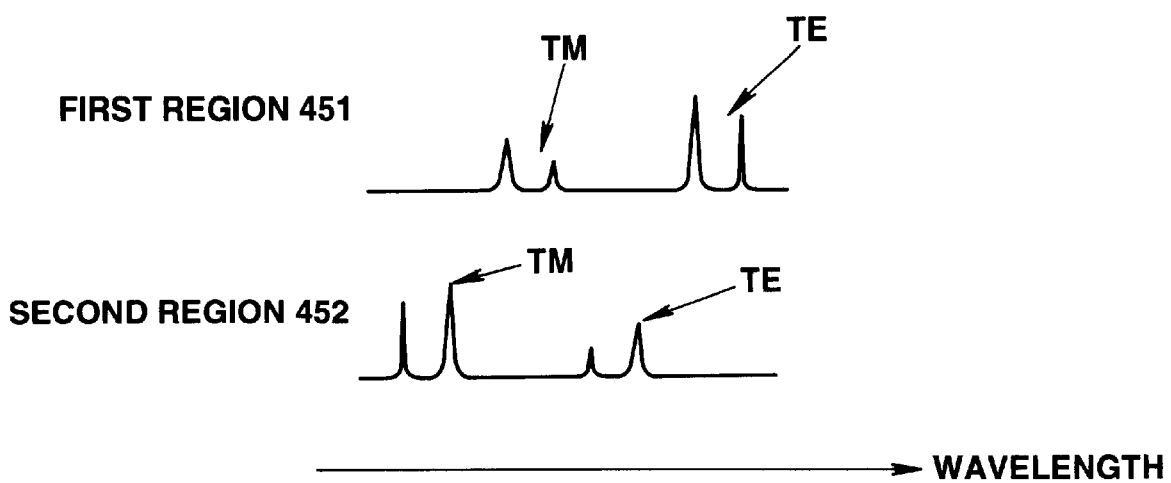
FIG. 8 is a view illustrating an operation of the fourth embodiment.

A fourth embodiment of the present invention, directed to a DFB semiconductor laser 420, will be described with reference to FIGS. 6 to 8. FIG. 7 shows a cross-sectional structure taken along a line 7–7' of FIG. 6, and FIG. 8 shows the operation of the fourth embodiment.

The device of this embodiment has the following structure. In FIGS. 6 and 7, reference numeral 401 designates an n-type InP substrate. Reference numeral 402 designates a buffer layer (also a first clad layer) of n-type InP. Reference numeral 403 designates an active layer. Reference numeral 404 designates a p-type InP second clad layer. Reference numeral 405 designates a p-type InGaAs contact (or cap) layer. Reference numeral 406 designates a semi-insulating (SI) InP burying layer. Reference numerals 407, 408 and 409 designate first, second and third electrodes, respectively. The first electrode is formed on substrate 401. The second and third electrodes are formed on layer 406. Reference numeral 410 designates a separating groove for electrically separating the second and third electrodes 408 and 409 from each other. Reference numeral 411 designates a diffraction grating of a pitch 240 nm and a depth of about 30 nm formed at the interface between the active layer 403 and the second clad layer 404.

The active layer 403 includes an active region 432 and separate confinement heterostructure (SCH) layers 431 and 433 for separating carrier confinement and optical confinement from each other, which respectively consist of portions 432$a$, 431$a$ and 433$a$ in a first region 451 corresponding to the second electrode 408 and portions 432$b$, 431$b$ and 433$b$ in a second region 452 corresponding to the third electrode 409.

In this embodiment, each of the active regions 432$a$ and 432$b$ has the same structure and is formed of InGaAsP with a bandgap wavelength of 1.6 $\mu$m. The upper SCH layers 433$a$ and 433$b$ are formed of different strained multiple quantum well structures, respectively. Here, the SCH layer 433$a$ is formed of a compressively-strained (about 1%, for example) quantum well structure, while the SCH layer 433$b$ is formed of a tensile-strained (about 1%, for example) quantum well structure. Each of the SCH layers 433$a$ and 433$b$ is formed of InGaAsP whose bandgap, say about 1.05 eV, is larger than that of the InGaAsP active region 432, so that light radiated or amplified by the active region 432 is not absorbed in those SCH layers.

The lower SCH layers 431a and 431b are formed of a common semiconductor layer, whose bandgap energy is larger than that of the active regions 432a and 432b but is smaller than that of the buffer and clad layer 402.

The device of this embodiment is fabricated as follows. The layers up to the SCH layers 433a and 433b (in this embodiment, the active regions 432a and 432b are formed of the same semiconductor structure, the SCH layers 431a and 431b are formed of the same semiconductor structure, and the SCH layers 433a and 433b can be formed similarly to the formation of the layers 304 and 305 of the third embodiment) are initially grown on the substrate 401 using a chemical beam epitaxy (CBE) method. The diffraction grating 411 is then formed using the holographic lithography method or an electron beam (EB) depicting method. After the formation of the diffraction grating, the second clad layer 404 and cap layer 405 are further formed using the CBE method.

Lateral waveguide structure and current constriction structure are formed on the thus-fabricated wafer. In this embodiment, to form the burying structure, wet etching or dry etching is performed using the photolithographical technique except for a portion for the waveguide (in this embodiment, a portion of a width of about 1.5 $\mu$m). Thereafter the semi-insulating burying layer 406 is grown to bury surroundings of the waveguide, using the CBE method. Furthermore, the substrate 401 is lapped, the electrodes are formed and the electrode separation for forming the two electrode regions 451 and 452 is performed to fabricate the device.

In this embodiment, the CBE method is used as a crystal growth method, but any growth method, such as MOCVD method and MBE method, can be used so long as the method can fabricate the semiconductor laser. For the processing, a conventional semiconductor processing can be used. Further, the burying structure is employed as the semiconductor laser structure in this embodiment, but any structure, such as a ridge structure and a pn burying structure, can be used, provided that the structure can be used in the semiconductor laser. This is true in the other embodiments, as well.

In the above structure, the diffraction grating 411 can be obtained, in which the coupling coefficient is larger for the TE mode than for the TM mode in the first region 451, and vice versa in the second region 452. This is because the refractive-index difference between the SCH layer 433a and the second clad layer 404 with the diffraction grating 411 formed at their interface is relatively large for the TE mode and relatively small for the TM mode in the first region 451, while the relation is inverted in the second region 452.

The operation of the fourth embodiment will be described. FIG. 8 shows amplified spontaneous emission (ASE) spectra occurring when currents below the threshold are injected into the respective regions 451 and 452 (stop bands appear since the diffraction grating 411 lacks a phase shift section). Although the active regions 432a and 432b are the same, the ASE component for the TE mode is larger in the first region 451 since the coupling coefficient is larger for the TE mode therein and the ASE component for the TM mode is larger in the second region 452 as the coupling coefficient is larger for the TM mode therein. Thus the feedback function of the diffraction grating 411 has a polarization dependency.

Furthermore, the difference in equivalent refractive indices sensed by TE-mode and TM-mode light differ between the first and second regions 451 and 452 because the layer structure of the light waveguide is different between those regions. Thus the Bragg wavelength difference between the TE mode and the TM mode is different between the first and second regions 451 and 452. The above fact is illustrated in FIG. 8 wherein the difference between the Bragg wavelengths (more accurately, the Bragg wavelength for each mode corresponds to a central wavelength between wavelengths of ASE component peaks of this (mode) for those modes indicated by the ASE component peaks in the first region 451 differ from that in the second region 452.

Figure 9:
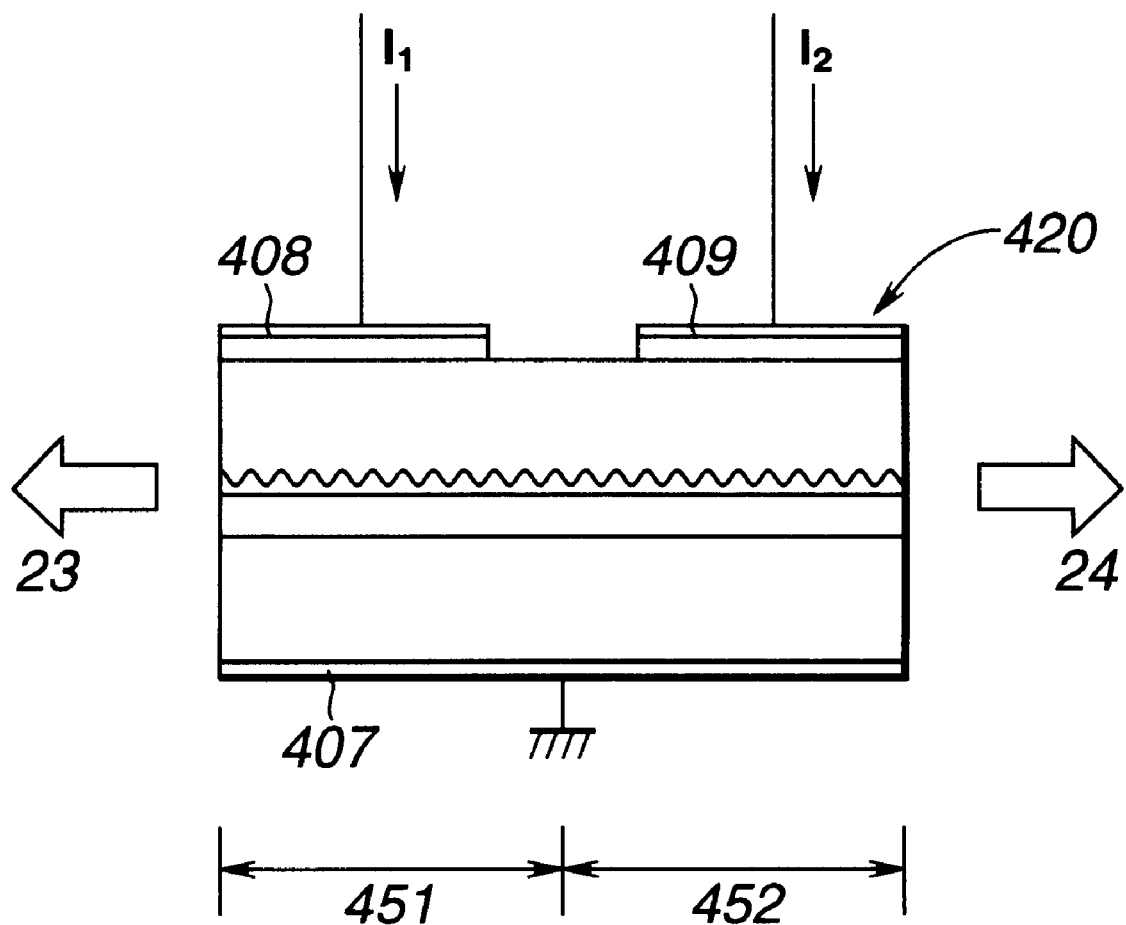
FIG. 9 is a view illustrating a driving method of a device of the present invention.

The current is injected into the above-discussed DFB semiconductor laser 420 as shown in FIG. 9. Currents $I_1$ and $I_2$ respectively injected into the first and second regions 451 and 452 can be independently controlled.

For example, wavelengths of the ASE peaks for the TE mode in the first and second regions 451 and 452 can be made coincident with each other by appropriately setting the currents $I_1$ and $I_2$ and changing the equivalent refractive indices due to the plasma effect (the refractive index decreases as carriers increase) and the effect of heat generation in the active region 432 (the refractive index increases as the temperature increases). More accurately, wavelengths at either end of the stop bands are made coincident with each other.

Under such a coincident condition, reflection or feedback at the coincident wavelength (in this case, or the TE mode) is maximized, and lasing light 23 and 24 can be obtained when the currents $I_1$ and $I_2$ exceed the threshold. As the current $I_2$ injected into the second region 452 is further increased from the above condition, the equivalent refractive index in the second region 452 changes or increases and wavelengths of ASE peaks for the TM mode in the first and second regions 451 and 452 can be in turn made coincident with each other. Under this condition, feedback at this coincident wavelength for the TM mode is maximized, and the polarization mode of the lasing light 23 and 24 turns to the TM mode.

Figure 10:
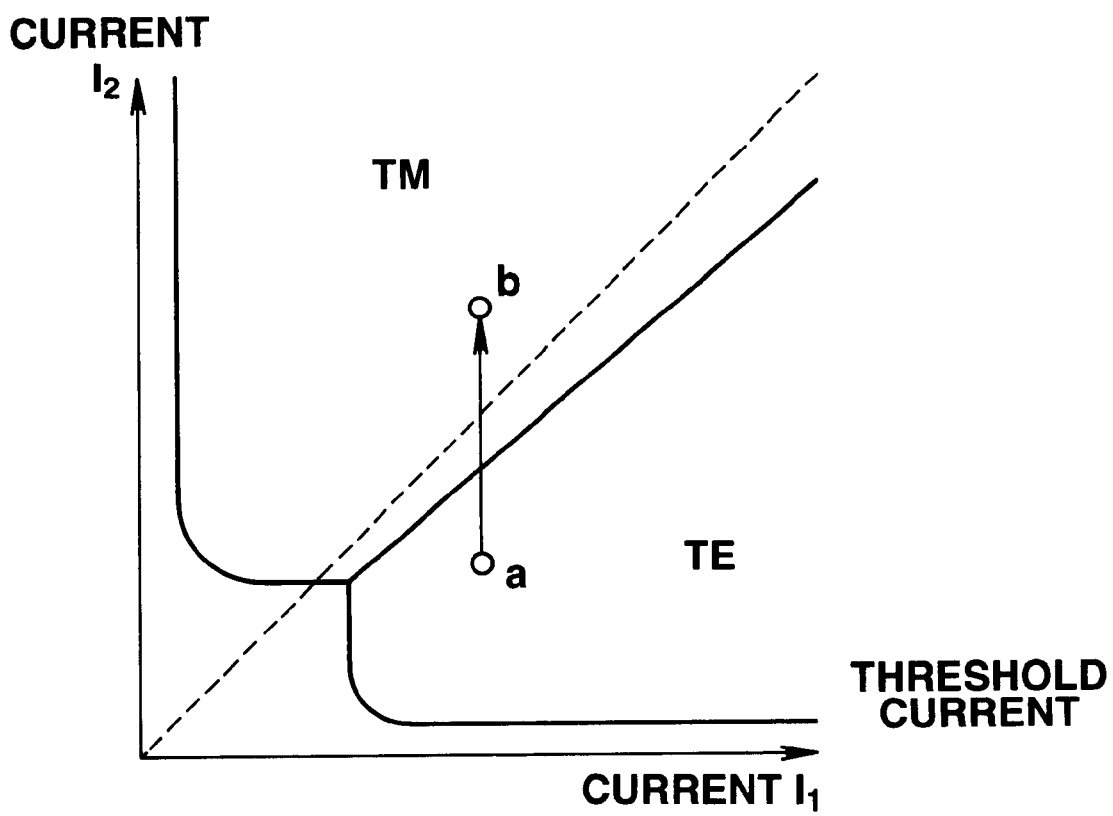
FIG. 10 is a graph illustrating an operation of the fourth embodiment.

FIG. 10 shows the relation between the lasing polarization mode (TE or TM mode) and the currents $I_1$ and $I_2$ in this embodiment. Since the structure of this embodiment is asymmetrical (i.e., polarization dependencies of the coupling coefficient of the diffraction grating 411 are different between the first and second regions 451 and 452), the region of the lasing polarization mode is divided into two, as illustrated in FIG. 10 wherein horizontal and vertical axes represent the currents $I_1$ and $I_2$ injected through the two electrodes 408 and 409, respectively. The above-discussed operation can be indicated by the motion from point a to point b shown in FIG. 10, for example. In this embodiment, the structure is designed such that oscillation in the TM mode occurs under a uniform current injection condition ($I_1$=$I_2$) as illustrated by a dotted line in FIG. 10.

Since the polarization dependencies of the coupling coefficient of the diffraction grating 411 differ between the first and second regions 451 and 452, it can be said that a trend in the difference between the light intensity distributions for the TE mode and the TM mode during operation time in the first region 451 is different from that in the second region 452. Therefore, conversely to the first embodiment, the lasing polarization mode of the fourth embodiment can also be switched using the operation method described in the first embodiment.

Fifth Embodiment

Figure 11:
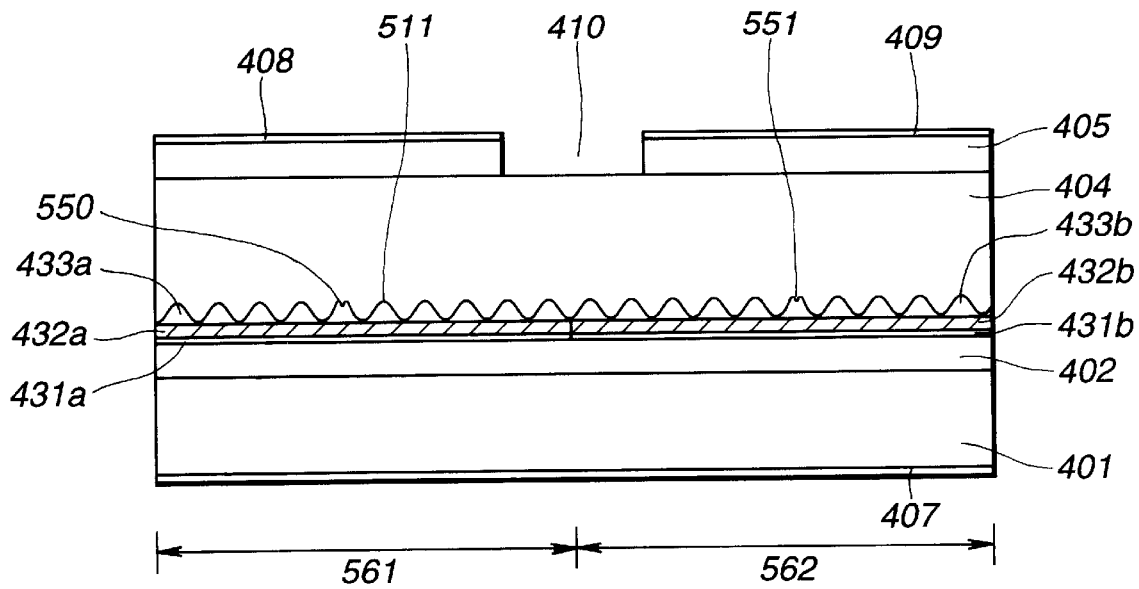
FIG. 11 is a cross-sectional view illustrating the cross section taken along a cavity-axial direction of a fifth embodiment of a DFB semiconductor laser according to the present invention.
Figure 12:
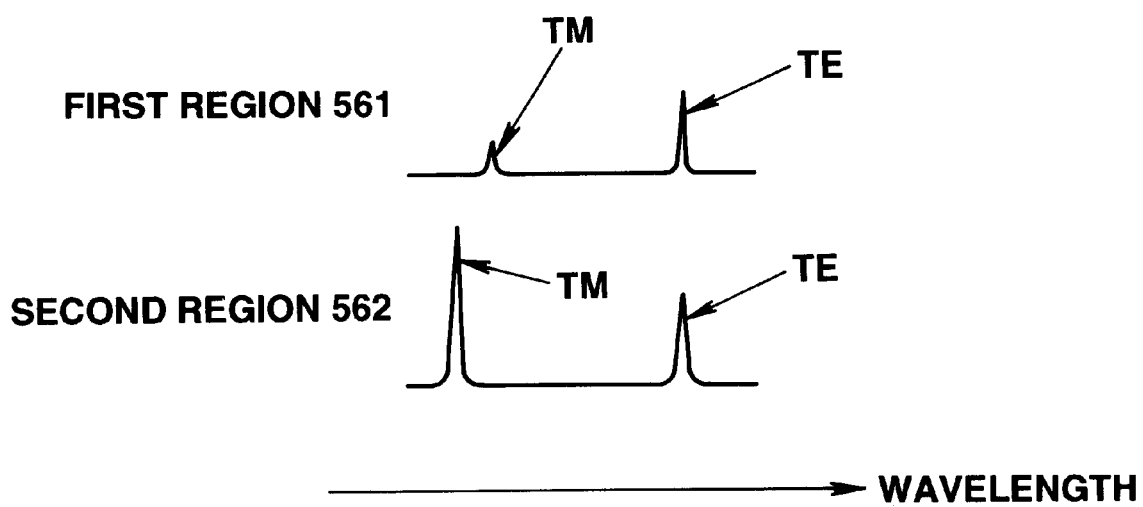
FIG. 12 is a view illustrating an operation of the fifth embodiment.

A fifth embodiment of the present invention, directed to a DFB semiconductor laser, will be described with reference to FIGS. 11 to 13. FIG. 11 shows a cross-sectional structure of the fifth embodiment, and FIG. 12 shows the operation of this embodiment. In FIG. 11, the same reference numerals as those in FIG. 7 denote substantially the same portions.

Quarter wavelength ($\lambda/4$) phase shift sections 550 and 551 are formed in a diffraction grating 511 in first and second regions 561 and 562 of this embodiment, respectively. Feedback functions of the diffraction grating 511 in the first and second regions 561 and 562 are designed as follows. The feedback amount for the TM mode is larger than, for example, about twice, that for the TE mode in the second region 562, while the feedback amount for the TE mode in the first region 561 is about as large as that for the TE mode in the second region 562 and the feedback amount for the TM mode in the first region 561 is much smaller than that for the TE mode in the first region 561 (see FIG. 12). Those relations can be achieved by appropriately selecting the material of the second clad layer 404 and materials and strain amounts of the upper SCH layers 433*a* and 433*b* such that the refractive-index differences between the layers 404 and 433*a* (or 433*b*) for the TE mode and the TM mode are properly set in the first and second regions 561 and 562, respectively. The above structure can be fabricated similarly to the fabrication method of the fourth embodiment.

FIG. 12 corresponds to FIG. 8 of the fourth embodiment and illustrates ASE spectra of the fifth embodiment. Since the $\lambda/4$ phase shift sections 550 and 551 are formed in the grating 511 of this embodiment, stop bands disappear and only one ASE component peak exists for each mode in the regions 561 and 562 in FIG. 12.

In the operation of this embodiment, oscillation occurs in the TM mode and at a wavelength corresponding to the ASE peak for the TM mode in the second region 562 when currents above the threshold are injected into the first and second regions 561 and 562, and no Bragg wavelengths for either polarization mode coincide with each other in the first and second regions 561 and 562. In turn, oscillation occurs in the TE mode when the currents injected into the two regions 561 and 562 are appropriately adjusted and the Bragg wavelengths for the TE mode in the two regions 561 and 562 are made coincident with each other (see the condition illustrated in FIG. 12).

Figure 13:
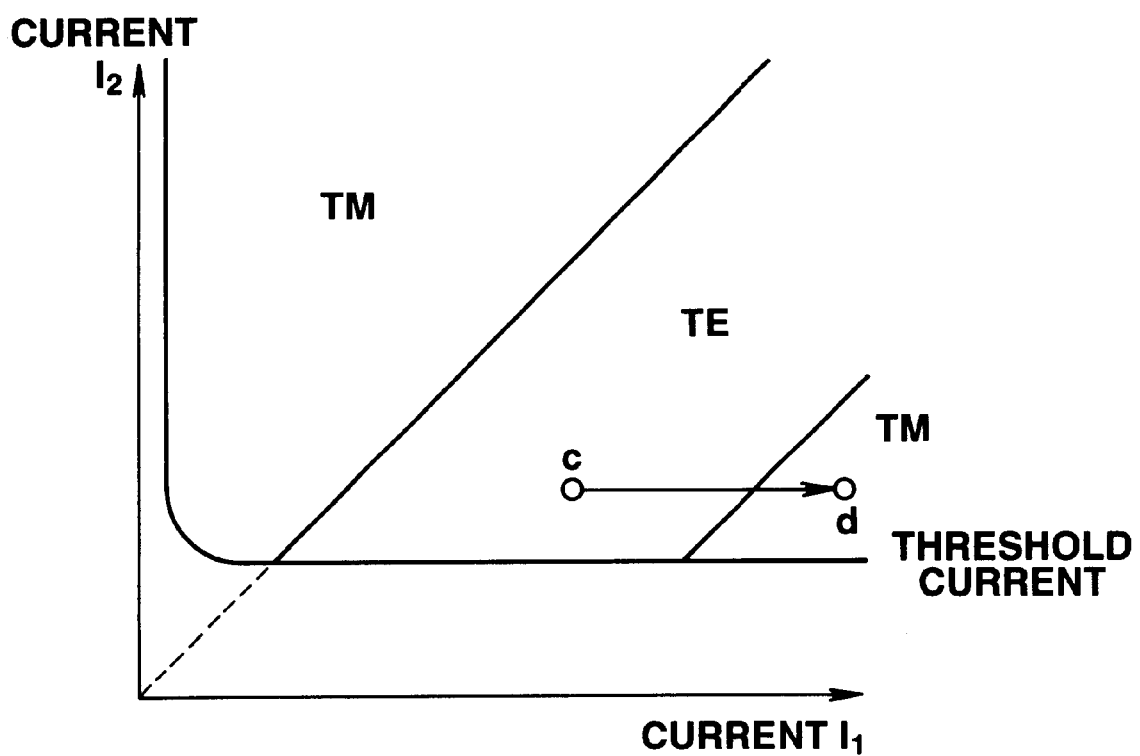
FIG. 13 is a graph illustrating an operation of the fifth embodiment.

FIG. 13 corresponds to FIG. 10 of the fourth embodiment. In this embodiment, as the current injected into the first region 561 increases from the condition of FIG. 12, oscillation in the TM mode occurs again because the Bragg wavelengths for the TE mode, coincident so far as illustrated in FIG. 12, deviate from each other again. Such operation can be illustrated by the motion from point c to point d in FIG. 13.

Sixth Embodiment

A sixth embodiment of the present invention, directed to an optical transmission system using a driving method of a light source for optical communication of the present invention, will be described with reference to FIG. 14.

Figure 14:
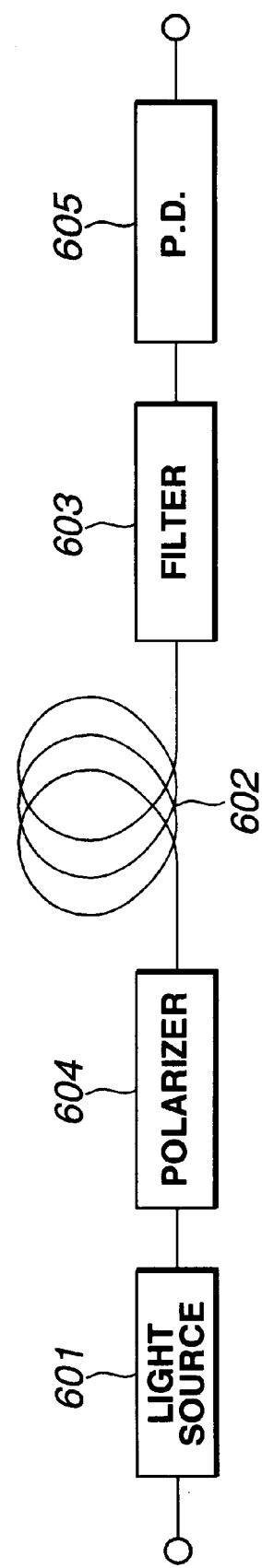
FIG. 14 is a block diagram illustrating an optical transmission system according to the present invention.

In FIG. 14, reference numeral 601 denotes a light source of the present invention, which can be modulated by changing its lasing polarization mode. Mode-modulated signal light emitted from the light source 601 is transmitted through a polarizer 604 such that the mode-modulated signal light is converted to an intensity-modulated signal light. The intensity-modulated signal light is coupled to a monomode optical fiber 602. The intensity-modulated signal light sent through the optical fiber 602 is selectively demultiplexed by an optical filter 603 in a receiver. The thus-selected light of a desired wavelength is detected by a photodetector 605, and a digital signal is demodulated. Here a tunable fiber Fabry-Perot filter is used as the filter 603. The filter 603 is unnecessary if merely one signal light at a certain wavelength is transmitted through the optical fiber 602. The filter 603 is needed when wavelength division multiplexed signals are transmitted through the optical fiber 602.

Although only one light source 601 and only one receiver are illustrated in FIG. 14, plural light sources and receivers connected by an optical coupler or the like can be used as well. A wavelength division multiplexing optical communication with a simple structure and advantageous performance can be achieved by using the light source of the present invention.

Seventh Embodiment

Figure 15:
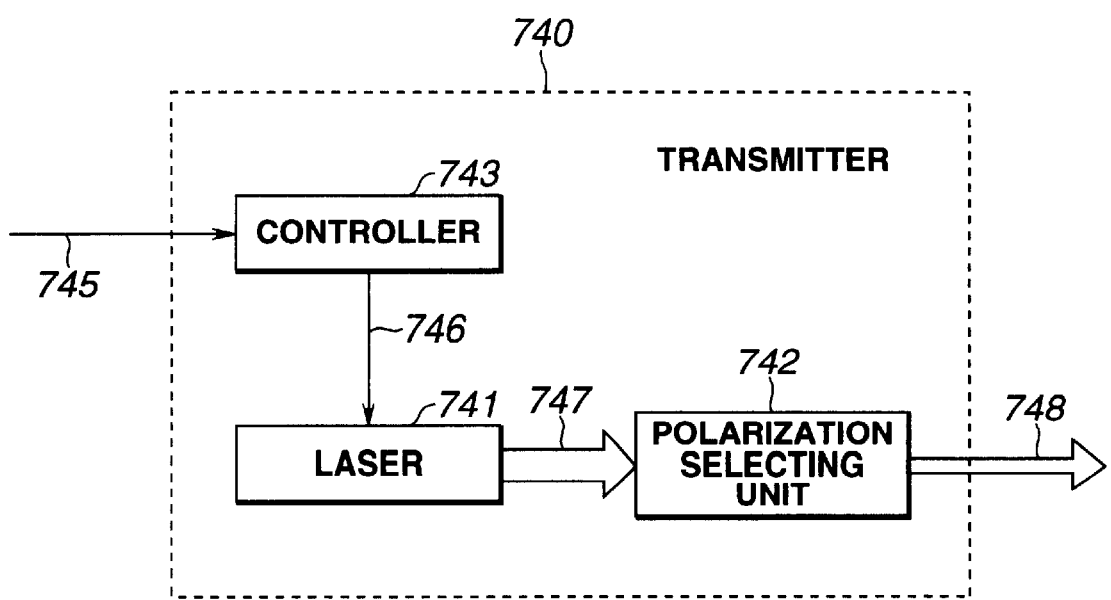
FIG. 15 is a block diagram illustrating an optical transmitter according to the present invention.

A seventh embodiment of the present invention, directed to an optical transmitter using a semiconductor laser of the present invention, will be described with reference to FIG. 15. In FIG. 15, reference numeral 740 designates an optical transmitter. Reference numeral 741 designates a semiconductor laser of the present invention. Reference numeral 742 designates a polarization selecting unit or polarizer. Reference numeral 743 designates a controller for the semiconductor laser 741. Reference numeral 745 designates an electric signal supplied to the controller 743. Reference numeral 746 designates a control or drive signal supplied to the laser 741 from the controller 743. Reference numeral 747 designates a light output of the laser 741. Reference numeral 748 designates an optical signal.

A polarizer or a polarization beam splitter can be used as the polarization selecting unit 742. An optical coupling unit may be used between the semiconductor laser 741 and the polarization selecting unit 742. An optical coupling unit, such as a lens, may be used to couple the signal 748 from the polarization selecting unit 742 to a transmission line, such as an optical fiber.

In the seventh embodiment, the controller 743 receives the electric signal 745 input into the transmitter 740, and the controller 743 supplies the drive signal 746, corresponding to the electric signal 745, to the semiconductor laser 741 to drive the laser 741. The semiconductor laser 741 receiving the drive signal 746 from the controller 743 switches the polarization mode of the light output 747 between the TE mode and the TM mode in accordance with the drive signal 746. The polarization selecting unit 742 generates the optical signal 748 in either the TE mode or the TM mode from the mode-switching optical output 747. The intensity-modulated optical signal 748 in one of the TE mode and the TM mode corresponds to (is in phase with) the electric signal 745.

The optical signal 748 may have the same waveform as the electric signal 745 or may be coded based on an appropriate conversion. In this case, the conversion may be performed by the controller 743.

Eighth Embodiment

Figure 16:
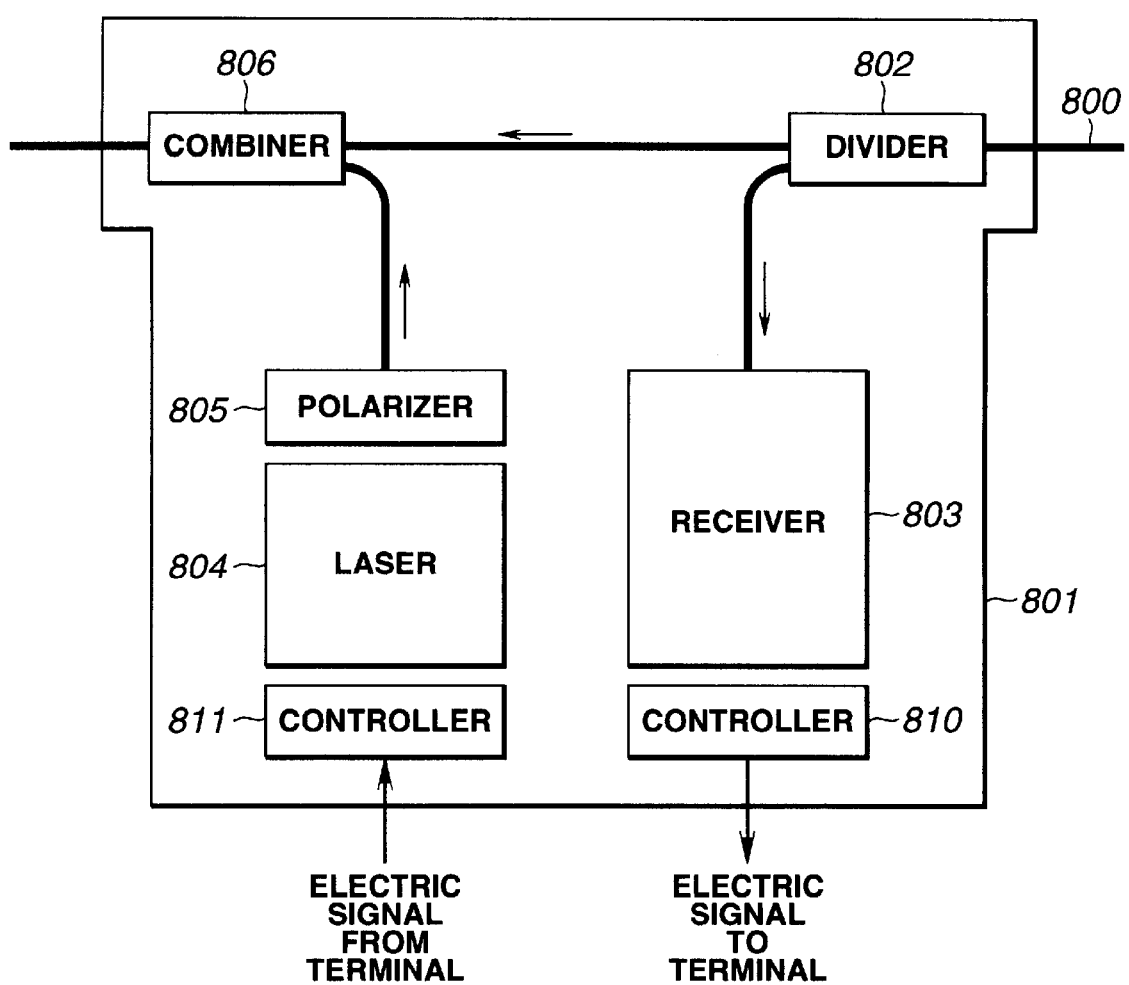
FIG. 16 is a block diagram illustrating an optical node according to the present invention.

An eighth embodiment will now be described with reference to FIGS. 16, 17 and 18. The eighth embodiment is directed to an optical local area network (LAN) system or a wavelength division multiplexing optical LAN system using a light source including an oscillation polarization switchable laser of the present invention. FIG. 16 illustrates an opto-electric converting unit (node) 801, which is connected to a terminal of the optical LAN system shown in FIG. 17 or FIG. 18.

In FIG. 16, an optical signal is taken into the node 801 through an optical fiber 800, and a portion of a signal is input into an optical receiver 803 by an optical power divider 802. The optical receiver 803 is controlled by a control circuit 810, and includes a tunable optical filter and a photodetector to select only signal light at a desired wavelength from the incident signal light and detect the selected signal.

On the other hand, when an optical signal is transmitted from the node 801, signal light from an oscillation polarization switchable semiconductor laser 804 of the present invention is input into the optical fiber 800 by a power combiner 806 through a polarizer 805 and an isolator (not shown). The laser 804 is appropriately driven by a control circuit 811 based on a signal according to the method described in the above embodiments, and a polarization-modulated light wave emitted from the laser 804 is converted to an intensity-modulated light output by the polarizer 805. The isolator may be omitted.

A plurality of tunable optical filters and semiconductor lasers may be arranged in a node to widen the wavelength tunable range.

Figure 17:
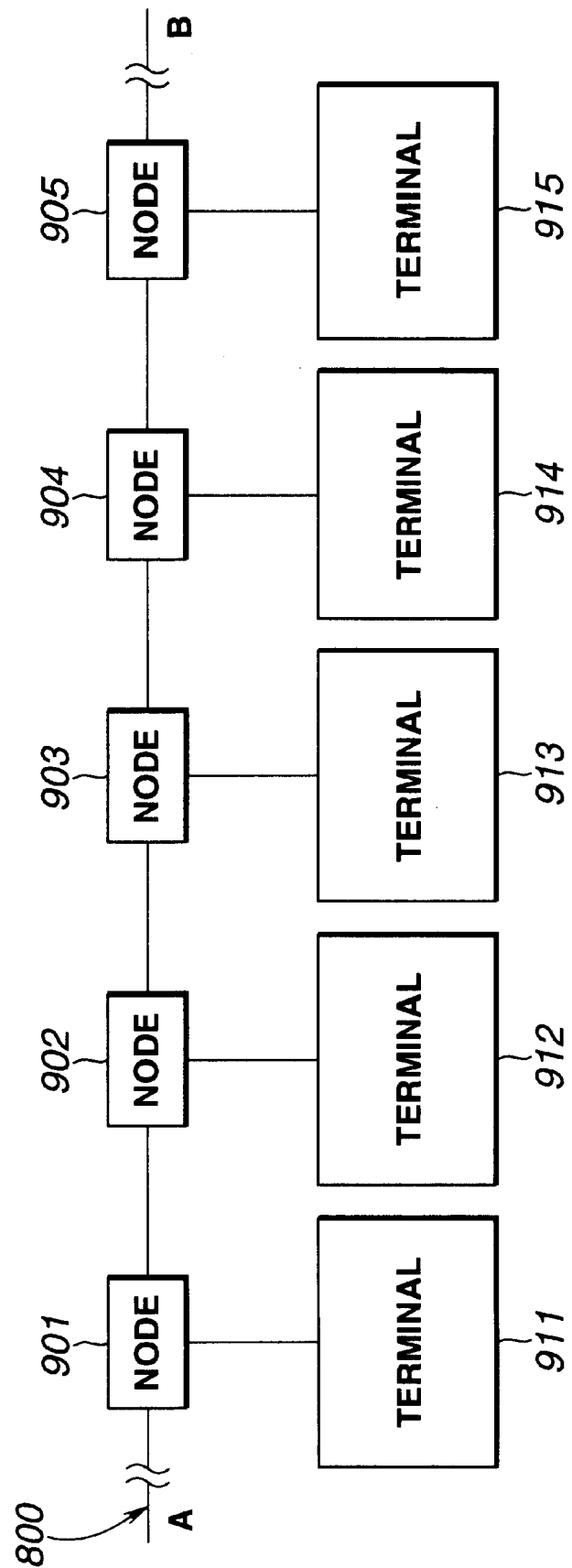
FIG. 17 is a block diagram illustrating a wavelength division multiplexing optical transmission system according to the present invention.

In a bus-type network shown in FIG. 17, multiple terminals or centers 911, 912, . . . 915 are connected to the optical fiber 800 respectively through optical nodes 901, 902, . . . 905 along a direction A-B. When a large number of nodes are connected, optical amplifiers need to be serially arranged on the transmission line 800 to compensate for attenuation of transmitted light.

Further, two nodes may be connected to each terminal and two optical fibers may be provided to accomplish bidirectional transmission of a distributed queue dual bus (DQDB) system.

As a network, a loop type (see FIG. 18), which is constructed by connecting A and B in FIG. 17, a star type, or compound configuration thereof may be used.

Figure 18:
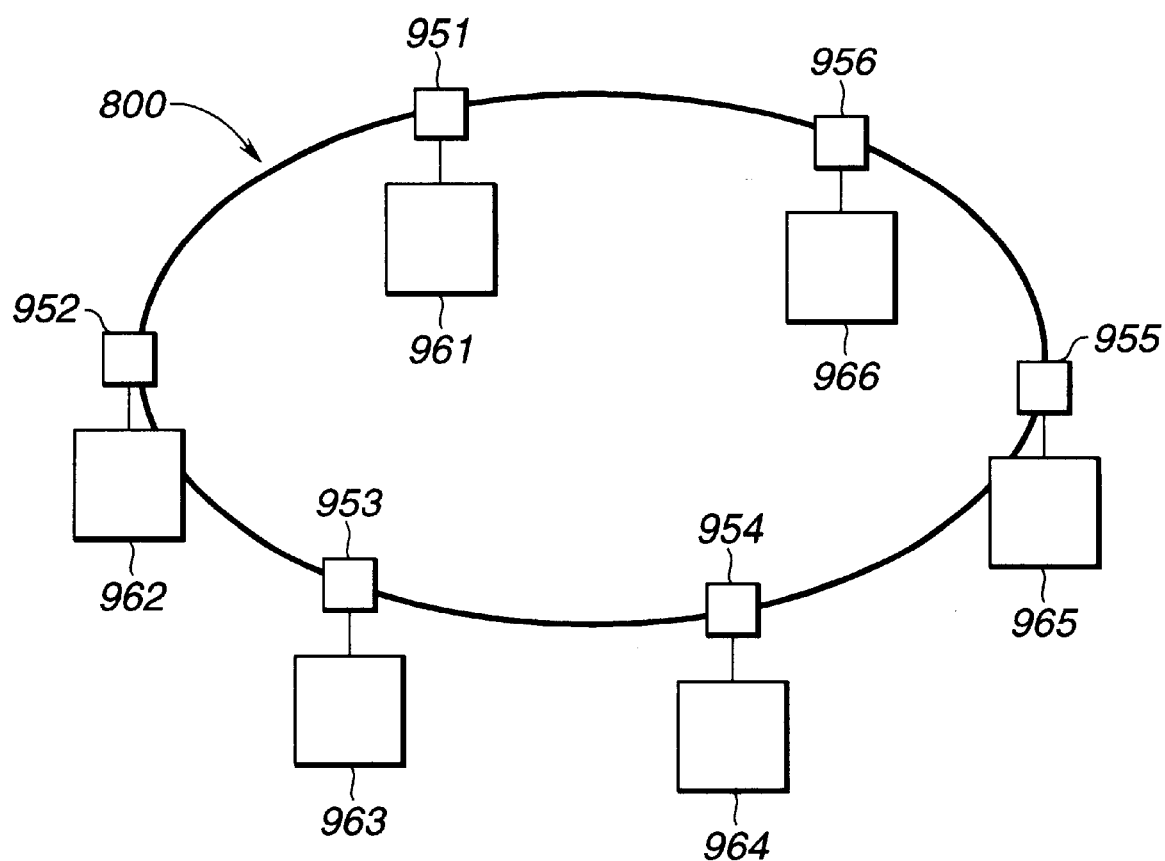
FIG. 18 is a block diagram illustrating another wavelength division multiplexing optical transmission system according to the present invention.

In the loop-type network shown in FIG. 18, reference numerals 951, 952, . . . 956 are nodes, and reference numerals 961, 962, . . . 966 are terminals, respectively.

Except as otherwise disclosed herein, the various components shown in outline or block form in any of the FIGS. 1–18 are individually well known in the optical semiconductor device, driving method, and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A distributed feedback semiconductor laser comprising a diffraction grating and an active layer extending in a cavity-axial direction, and including a first region and a second region which are capable of being independently pumped, wherein, in said first region, a first polarization mode light intensity is made greater than a second polarization mode light intensity, and in said second region, the second polarization mode light intensity is made greater than the first polarization mode light intensity, by not providing said first region with a compressively-strained multiple quantum well light guide layer, and providing said second region with a compressively-strained multiple quantum well light guide layer.

2. A distributed feedback semiconductor laser according to claim 1, wherein in said first region, a coupling coefficient of the first polarization mode light is greater than a coupling coefficient of the second polarization mode light, and in said second region the coupling coefficient of the second polarization mode light is greater than the coupling coefficient of the first polarization mode light.

3. A distributed feedback semiconductor laser comprising a diffraction grating and an active layer extending in a cavity-axial direction, and including a first region and a second region which are capable of being independently pumped, wherein, in said first region, a coupling coefficient of a first polarization mode light is made greater than a coupling coefficient of a second polarization mode light, and in said second region, the coupling coefficient of the second polarization mode light is made greater than the coupling coefficient of the first polarization mode light, by providing said first region with a compressively-strained multiple quantum well light guide layer having a first double refractive index, and providing said second region with a compressively-strained multiple quantum well light guide layer whose double refractive index is greater than that of the first double refractive index.

4. A distributed feedback semiconductor laser comprising a diffraction grating and an active layer extending in a cavity-axial direction, and including a first region and a second region which are capable of being independently pumped, wherein, in said first region, a coupling coefficient of a first polarization mode light is made greater than a coupling coefficient of a second polarization mode light, and in said second region, the coupling coefficient of the second polarization mode light is made greater than the coupling coefficient of the first polarization mode light, by providing said first region with a compressively-strained multiple quantum well light guide layer, and providing said second region with a tensile-strained multiple quantum well light guide layer.

5. A light source apparatus comprising a distributed feedback semiconductor laser according to any one of claims 1–4, and polarization-mode selecting means.

6. A light transmission system which is characterized by the usage of a light source apparatus according to claim 5.

7. A distributed feedback semiconductor laser according to any one of claims 1–4, wherein a wavelength difference between Bragg wavelengths for the first and second polarization modes in said first region are different from a wavelength difference between Bragg wavelengths for the first and second polarization modes in said second region, and said laser being constructed such that when a wavelength of a minimum oscillation threshold for one of the first and second polarization modes in said first region coincides with a wavelength of a minimum oscillation threshold for the one of the first and second polarization modes in said second region, an oscillation threshold gain at the coincident wavelength is smallest of the threshold gains of a plurality of resonance modes created by said diffraction grating.

8. A distributed feedback semiconductor laser according to any one of claims 1–4, wherein a coupling coefficient of said diffraction grating for the second polarization mode in said second region is sufficiently large and a coupling coefficient of said diffraction grating for the first polarization mode in said second region is approximately zero.

9. A distributed feedback semiconductor laser according to any one of claims 1–4, further comprising a phase shift section formed in said diffraction grating in each of said first and second regions such that wavelengths of minimum oscillation thresholds for the first and second polarization modes are Bragg wavelengths in said first and second regions, respectively.

10. A distributed feedback semiconductor laser according to any one of claims 1–4, wherein the first polarization mode is one of TE and TM modes and the second polarization mode is the other of the TE and TM modes.

* * * * *

UNITED STATES PATENT AND TRADEMARK OFFICE
CERTIFICATE OF CORRECTION

PATENT NO. : 6,252,895 B1
DATED : June 26, 2001
INVENTOR(S) : Jun Nitta et al.

It is certified that error appears in the above-identified patent and that said Letters Patent is hereby corrected as shown below:

<u>Column 10,</u>
Line 5, "and second" (second occurrence) should be deleted.

<u>Column 11,</u>
Line 64, "electrode 308" should read -- electrode 309 --.

<u>Column 14,</u>
Line 7, "(made)" should read -- made) --.

<u>Column 17,</u>
Line 59, "wherein" should read -- wherein, --.

<u>Column 18,</u>
Line 38, "are" should read -- is --; and
Line 45, "the one" should read -- one --.

Signed and Sealed this

Ninth Day of April, 2002

*Attest:*

*Attesting Officer*

JAMES E. ROGAN
*Director of the United States Patent and Trademark Office*